(12) United States Patent
Araki et al.

(10) Patent No.: US 10,141,180 B2
(45) Date of Patent: Nov. 27, 2018

(54) SILICON WAFER AND METHOD FOR MANUFACTURING THE SAME

(71) Applicant: GLOBALWAFERS JAPAN CO., LTD., Niigata (JP)

(72) Inventors: Koji Araki, Niigata (JP); Tatsuhiko Aoki, Niigata (JP); Haruo Sudo, Niigata (JP); Takeshi Senda, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 70 days.

(21) Appl. No.: 14/448,077

(22) Filed: Jul. 31, 2014

(65) Prior Publication Data
US 2015/0044422 A1 Feb. 12, 2015

(30) Foreign Application Priority Data

Aug. 7, 2013 (JP) ................................ 2013-163958

(51) Int. Cl.
*C30B 33/02* (2006.01)
*H01L 21/02* (2006.01)
(Continued)

(52) U.S. Cl.
CPC ...... *H01L 21/02008* (2013.01); *C30B 15/206* (2013.01); *C30B 29/06* (2013.01);
(Continued)

(58) Field of Classification Search
CPC ........... H01L 21/02008; H01L 21/3225; H01L 21/324; C30B 15/206; C30B 29/06; C30B 33/02; Y10T 428/24488; Y10T 428/31
See application file for complete search history.

(56) References Cited

U.S. PATENT DOCUMENTS 6,143,071 A * 11/2000 Aihara ................... C30B 29/06
117/1
6,492,682 B1 * 12/2002 Akiyama .......... H01L 21/76251
257/347
(Continued)

FOREIGN PATENT DOCUMENTS

JP 2001-509319 7/2001
JP 2010-40587 2/2010
(Continued)

OTHER PUBLICATIONS

Office Action dated Mar. 27, 2015 in corresponding Japanese Application No. 2013-163958, with English translation.

*Primary Examiner* — Jonathan C Langman
(74) *Attorney, Agent, or Firm* — Wenderoth, Lind & Ponack, L.L.P.

(57) ABSTRACT

A silicon wafer is manufactured by subjecting a silicon wafer sliced from a silicon single-crystal ingot grown by the Czochralski process to a rapid thermal process in which the silicon wafer is heated to a maximum temperature within a range of 1300 to 1380° C., and kept at the maximum temperature for 5 to 60 seconds; and removing a surface layer of the wafer where a semiconductor device is to be manufactured by a thickness of not less X [μm] which is calculated according to the below equations (1) to (3):

$X\ [\mu m] = a\ [\mu m] + b\ [\mu m]$ (1);

$a\ [\mu m] = (0.0031 \times (\text{said maximum temperature})\ [°C.] - 3.1) \times 6.4 \times (\text{cooling rate})^{-0.4}\ [°C./\text{second}]$ (2); and $b\ [\mu m] = a/(\text{solid solubility limit of oxygen})\ [\text{atoms}/cm^3]/(\text{oxygen concentration in substrate})\ [\text{atoms}/cm^3]$ (3).

3 Claims, 1 Drawing Sheet

(51) Int. Cl.
*C30B 29/06* (2006.01)
*C30B 15/20* (2006.01)
*H01L 21/322* (2006.01)
*H01L 21/324* (2006.01)

(52) U.S. Cl.
CPC ............ *C30B 33/02* (2013.01); *H01L 21/324* (2013.01); *H01L 21/3225* (2013.01); *Y10T 428/24488* (2015.01); *Y10T 428/31* (2015.01)

(56) References Cited

U.S. PATENT DOCUMENTS

| | | | |
|---|---|---|---|
| 2006/0016385 A1* | 1/2006 | Ono | C30B 29/06 117/3 |
| 2008/0113171 A1* | 5/2008 | Nakai | C30B 15/206 428/218 |
| 2010/0038757 A1 | 2/2010 | Isogai et al. | |
| 2012/0043644 A1* | 2/2012 | Ono | C30B 29/06 257/607 |

FOREIGN PATENT DOCUMENTS

| | | |
|---|---|---|
| JP | 2010-129918 | 6/2010 |
| WO | 98/38675 | 9/1998 |

\* cited by examiner

SILICON WAFER AND METHOD FOR MANUFACTURING THE SAME

CROSS REFERENCE TO RELATED APPLICATIONS

This application is based on and claims priority under 35 U.S.C. sctn. 119 with respect to Japanese Patent Application No. 2013-163958 filed on Aug. 7, 2013, the entire content of which is incorporated herein by reference.

BACKGROUND OF THE INVENTION

This invention relates to a silicon wafer (hereinafter sometimes simply referred to as the "wafer") suitable for use as a substrate on which a semiconductor device is to be manufactured, and a method for manufacturing such a wafer.

For a silicon wafer for use as a substrate on which a semiconductor device is to be manufactured, it is required that its surface layer which is used as an active region where a semiconductor device is to be manufactured be free of defects by reducing e.g. crystal-originated particles (COPs) and laser scattering tomography defects (LSTDs).

In order to improve productivity of such a silicon wafer, in a recently developed method, at least the surface of the silicon wafer on which a semiconductor device is to be manufactured is mirror-polished, and then the silicon wafer is subjected to a rapid thermal process (hereinafter abbreviated to "RTP").

For example, JP Patent Publication 2001-509319A discloses a thermal treatment in which the wafer is heated at a temperature exceeding 1175° C. for less than 60 seconds in an argon or helium atmosphere containing oxygen under the oxygen partial pressure of less than 5000 ppma.

The heat treatment disclosed in this patent publication can markedly reduce COPs on the surface layer of the wafer because RTP is performed in an inert gas atmosphere of which argon or helium is the major component.

However, during RTP in an inert gas atmosphere, oxygen in the surface layer of the wafer tends to be dispersed outwardly, so that the oxygen concentration in the surface layer decreases. This reduces the pinning effect of oxygen during heat treatment in the later step of manufacturing a semiconductor device. Thus, the higher the temperature of the heat treatment, the more likely slip dislocations are to occur.

In order to avoid this problem, JP Patent Publication 2010-129918A proposes to subject a semiconductor wafer to a heat treatment of not less than 1000° C. and not more than the melting point in a furnace in an oxygen-containing gas atmosphere, thereby inwardly dispersing and introducing oxygen into the surface layer of the wafer, and then take the wafer out of the furnace to fix the high solid solubility of oxygen in the surface layer of the wafer. By performing this method, it is possible to increase the oxygen concentration in the surface layer, thereby increasing the strength of the surface layer.

However, if RTP is performed in an oxygen-containing gas atmosphere as disclosed in JP Patent Publication 2010-129918, especially if the RTP is performed at a temperature of less than 1300° C., there are the following two problems. One is that since the oxygen concentration in the surface layer of the wafer has increased due to inward dispersion of oxygen, oxide films on the inner walls of COPs are less likely to melt, so that COPs cannot be easily removed. Another problem is that since it is impossible to melt oxygen precipitation nuclei produced while crystals are growing, if the nuclei have ununiform density and size distributions in the radial direction of the surface of the wafer, these nuclei could grow into oxygen precipitates that are ununiform in density and size during the later heat treatment step, thus reducing the strength of the wafer.

On the other hand, if the heat treatment temperature is 1300° C. or higher, it is possible to melt oxide films on the inner walls of COPs, thereby removing the COPs, and also melt the oxygen precipitation nuclei produced while crystals are growing. In this case, however, oxygen precipitation nuclei tend to be produced in high density in the surface layer of the wafer as the active region where the semiconductor device is to be manufactured.

SUMMARY OF THE INVENTION

An object of the present invention is to solve the above-mentioned problems. More specifically, the object of the present invention is to provide a silicon wafer which is less likely to suffer from slip dislocations during heat treatment in the step of manufacturing a semiconductor device, which has less crystal defects, such as COPs and oxygen precipitation nuclei, in the region where a semiconductor device is to be manufactured, and in which oxygen precipitation nuclei in the bulk portion are distributed uniformly in the radial direction of the surface of the wafer, and a method of manufacturing such a silicon wafer.

The present invention provides a method of manufacturing a silicon wafer comprising the steps of subjecting a silicon wafer sliced from a silicon single-crystal ingot grown by the Czochralski process to a rapid thermal process in which the silicon wafer is heated to a maximum temperature within a range of 1300 to 1380° C., and kept at the maximum temperature for 5 to 60 seconds, and removing a surface layer of the wafer where a semiconductor device is to be manufactured by a thickness of not less than X [μm] which is calculated according to the below-identified equations (1) to (3):

$$X\ [\mu m]=a\ [\mu m]+b\ [\mu m] \qquad (1);$$

$$a\ [\mu m]=(0.0031\times(\text{said maximum temperature})\ [^\circ C.]-3.1)\times 6.4\times(\text{cooling rate})^{-0.4}\ [^\circ C./second] \qquad (2);\ \text{and}$$

$$b\ [\mu m]=a/(\text{solid solubility limit of oxygen})\ [\text{atoms}/cm^3]/(\text{oxygen concentration in substrate})\ [\text{atoms}/cm^3] \qquad (3).$$

This method effectively reduces slip dislocations during heat treatment in the step of manufacturing a semiconductor device, reduces crystal defects in the region of the completed silicon wafer where a semiconductor device is to be manufactured, and allows the oxygen precipitation nuclei in the bulk portion of the completed silicon wafer to be arranged uniformly in the radial direction of the surface of the wafer.

Preferably, during the above-mentioned removing step, the side peripheral surface of the wafer is removed by not more than the above-defined "a". With this arrangement, since oxygen precipitation nuclei remain in the side peripheral portion, the strength of the wafer improves, which in turn reduces slip dislocation.

The bevel surface of the wafer is preferably removed such that oxygen precipitation nuclei are exposed. The bevel surface refers to a region of the surface of the wafer including the chamfered portion and the portion of the surface on which a semiconductor device is to be manufactured within 100 μm from the peripheral edge of this surface. Such a bevel surface ensures a more uniform temperature distribution on the surface, reduces slip dislocation, and effectively releases internal stress.

The silicon wafer according to the present invention is characterized in that it is manufactured by the above-described method, in which at least the surface layer in which a semiconductor device is to be manufactured is free of COPs and oxygen precipitation nuclei, and includes a layer containing oxygen precipitation nuclei on the peripheral edge portion of the wafer.

In such a wafer, the oxygen precipitation nuclei in the peripheral edge portion of the wafer improve strength and the gettering effect of metal impurities, without detrimentally influencing the device performance such as causing leakage. Such a wafer is therefore suitable as a substrate on which a semiconductor device is to be manufactured.

In order to avoid any detrimental influence on the device performance, the bulk portion, which is the portion of the wafer not less than 20 μm deep from the entire surface of the wafer, is preferably free of COPs and oxygen precipitation nuclei.

Otherwise, in order to improve the strength of the wafer and to ensure the gettering effect of metal impurities, oxygen precipitation core layers are formed uniformly in the bulk portion and the peripheral edge portion.

In the latter case, oxygen precipitation nuclei are preferably distributed such that the oxygen precipitation nuclei have a density of $5.0 \times 10^8$ to $9.0 \times 10^9$/cm3, and a size of 30 to 100 nm, after the wafer has been kept at 1000° C. for four hours in an argon atmosphere.

Preferably, oxygen precipitation nuclei are exposed to the bevel surface of the silicon wafer. The oxygen precipitation nuclei exposed to the bevel surface serve to effectively reduce slip dislocation during the later heat treatment.

For the gettering effect of metal impurities, the surface layer of the wafer opposite to the device manufacturing surface preferably contains oxygen precipitation nuclei.

By using the method of manufacturing a silicon wafer according to the present invention, it is possible to reduce crystal defects in the device region of the wafer, and to control oxygen precipitation nuclei in the bulk portion so as to be distributed uniformly in the radial direction in the surface. Thus, in the silicon wafer according to the present invention, slip dislocations decrease and the strength improves. Such a silicon wafer is therefore suitable as a substrate for a semiconductor device.

DETAILED DESCRIPTION OF THE PREFERRED EMBODIMENTS

Figure 1:
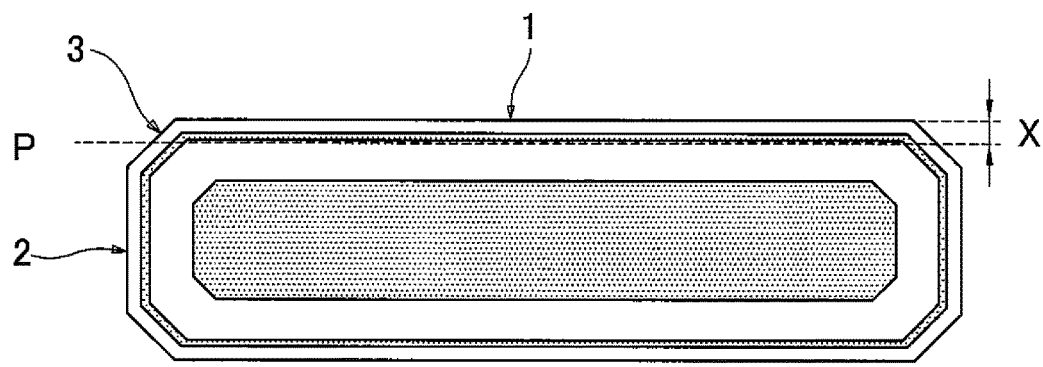
FIG. 1 schematically shows distribution of oxygen precipitation nuclei on a section of a silicon wafer.

Now the present invention is described in a detailed manner. The method of manufacturing a silicon wafer according to the present invention includes the step of subjecting a silicon wafer sliced from a silicon single-crystal ingot grown by the Czochralski process to a predetermined RTP, and the below-described predetermined removal step. By performing the RTP and then the removal step, crystal defects decrease in the device region of the completed silicon wafer, and oxygen precipitation nuclei in the bulk portion of the completed silicon wafer are uniformly arranged in the radial direction of the surface of the wafer.

During the RTP, which is performed in an oxygen-containing atmosphere, the wafer is heated to a maximum temperature within a range of 1300 to 1380° C., and kept at the maximum temperature for 5 to 60 seconds. By performing such RTP, it is possible to effectively eliminate COPs and oxygen precipitation nuclei that have been produced during growth of the silicon single-crystal ingot such that they are ununiform both in density and size in the radial direction of the surface of the wafer.

COPs and oxygen precipitation nuclei disappear presumably in the following manner. First, oxide films ($SiO_2$) on the inner walls of COPs melt during RTP and are dispersed leaving vacancies. Then, a large amount of interstitial silicon injected into the wafer in an oxygen-containing atmosphere fills up the vacancies, thus eliminating the COPs. But in the surface layer, since the oxygen concentration is oversaturated by the RTP, oxide films on the inner walls of COPs are less likely to melt, so that COPs tend to remain in this region. Oxygen precipitation nuclei, which have been produced during growth of the single-crystal ingot, melt in the wafer and disappear during RTP.

During the cooling stage of the RTP, COPs and oxygen precipitation nuclei disappear, and further, according to the cooling rate, the oxygen precipitation nuclei disappear over the entire wafer, or oxygen precipitation nuclei are arranged uniformly in the radial direction of the surface. If the cooling rate is high, oxygen precipitation nuclei tend to be newly produced. If the cooling rate is low, vacancies and interstitial silicon are annihilated, and the concentration decreases. As a result, oxygen precipitation nuclei are less likely to form. On the other hand, in the surface layer region deeper than the region where COPs tend to remain, vacancies generated mainly during RTP form composites in cooperation with oxygen, of which the concentration has increased during RTP, thus forming new oxygen precipitation nuclei.

The depths of COPs in the surface layer, the density and depths of oxygen precipitation nuclei in the surface layer vary with the RTP conditions and the oxygen concentration in the wafer before RTP.

The partial pressure of oxygen gas in the oxygen-containing atmosphere is preferably 20 to 100%, more preferably 100%. If the partial pressure is less than 20%, it is impossible to inject a sufficiently large amount of interstitial silicon into the wafer, thus making it difficult to reliably reduce COPs.

The gas flow rate at this time is 20 slm (standard liter per minute) or over. If the gas flow rate is less than 20 slm, the displacement efficiency of air flowing into the chamber decreases, thus reducing the effect of eliminating COPs. Gas other than oxygen gas is preferably argon gas, because argon gas prevents formation of other films such as nitride films or chemical reactions, during RTP.

The maximum temperature reached during RTP should be not less than 1300° C. and not more than 1380° C. If less than 1300° C., oxide films on the inner walls of COPs are less likely to be melted due to low solid solubility of oxygen. Also, since interstitial silicon is not produced sufficiently, COPs cannot be eliminated sufficiently. It is further difficult to sufficiently eliminate oxygen precipitation nuclei that have been generated ununiformly in the surface during growth of the silicon single-crystal ingot. If the above maximum temperature is higher than 1380° C., such a temperature is so high as to increase the possibility of slip dislocations. In order to effectively eliminate COPs and oxygen precipitation nuclei, the above maximum temperature is preferably not less than 1350° C. and not more than 1380° C.

In order to effectively eliminate COPs and oxygen precipitation nuclei and for efficient treatment, the wafer should be kept at the maximum temperature for 5 to 60 seconds.

During the cooling stage, in order to keep the entire bulk portion of the wafer free of oxygen precipitation nuclei, the cooling rate is preferably controlled to not more than 10° C./second, more preferably to 3 to 5° C./second. If the cooling rate is less than 3° C./second, not only does productivity deteriorate, but also the members forming the entire apparatus could be heated excessively and damaged because the heat treatment continues for an extremely long period of time.

Alternatively, if it is desired to form a wafer in which oxygen precipitation nuclei are uniformly distributed in the radial direction of the wafer surface in the bulk portion, the cooling rate is preferably controlled to not less than 50° C./second, more preferably 120 to 180° C./second. If higher than 180° C./second, slip dislocation may occur in the wafer.

After such RTP step, the surface layer of the wafer is removed. FIG. 1 shows the distribution of oxygen precipitation nuclei after the RTP step on a section of the wafer. As shown in FIG. 1, the device manufacturing surface 1 of the wafer is removed by not less than the value X calculated by the above-described equations (1) to (3), to the depth indicated by the letter P in FIG. 1.

The above equation (2) indicates the distance from the surface of the wafer to the maximum oxygen concentration region. The maximum oxygen concentration refers to the peak value of the concentration of oxygen produced in the surface layer of the wafer by the RTP. In the equation (2), the maximum temperature and the cooling rate are values in the temperature sequence of the RTP.

The equation (3) indicates the range where there are oxygen precipitation nuclei from the maximum oxygen concentration region toward the bulk portion of the wafer. "Solid solubility limit of oxygen" in equation (3) is the limit concentration of oxygen below which oxygen can stably exist in the silicon single crystals in a dissolved form at the above maximum temperature. "Oxygen concentration in substrate" is the oxygen concentration in the bulk portion of the silicon wafer, and is the concentration of oxygen introduced into the silicon single-crystal ingot grown by the Czochralski process. These oxygen concentrations are calculated based on a conversion factor of old-ASTM standards.

By calculating the thickness of material to be removed based on the above equations, and removing material of the wafer to a depth deeper than the maximum oxygen concentration region, it is possible to remove oxygen precipitation nuclei in the surface layer of the wafer with high reliability and high productivity, even under different RTP conditions and/or even if the oxygen concentration is varied. From the viewpoint of productivity, the thickness of material removed should not exceed 20 μm.

The method of removing material of the wafer is not particularly limited, but ordinarily, material of the wafer is removed by sliding polishing cloth along one or both sides of the wafer with slurry disposed therebetween. Otherwise, Grinding with a grinder and a lapping surface plate may be employed together with chemical etching.

In the above-described removing step, the side peripheral surface of the wafer is preferably removed by not more than the above-defined value "a". By removing the side peripheral surface by not more than the value "a", it is possible to reliably retain oxygen precipitation nuclei in the side peripheral portion, which in turn reduces slip dislocation and improves strength of the wafer. More preferably, the side peripheral surface is removed by the amount "a". With this arrangement, the oxygen concentration in the side peripheral portion of the wafer becomes maximum, so that it is possible to further improve strength of the wafer.

In the above removing step, the bevel surface 3 of the wafer is preferably removed such that oxygen precipitation nuclei are exposed. During heat treatment in which the wafer edge is supported, if oxygen precipitation nuclei are exposed to or present in the wafer edge portion, heat absorbed in the edge portion increases, thus compensating for heat released through the supported edge portion. This improves uniformity in temperature in the surface and reduces slip dislocation. Also, if dislocation is generated from oxygen precipitates under large stress, dislocation spreads from exposed oxygen precipitation nuclei, thus effectively releasing internal stress.

In the silicon wafer obtained by the above-described method according to the present invention, the device region (region from the surface to the depth of 15 to 20 μm) of the wafer is free of COPs and oxygen precipitation nuclei, while the peripheral edge portion of the wafer includes an oxygen precipitation nuclei-containing region. The thus formed wafer does not detrimentally influence the performance of the device, while the oxygen precipitation nuclei-containing layer in the peripheral edge portion of the wafer improves strength of the wafer.

The bulk portion of this silicon wafer, which is the region 20 μm or deeper from all of the surfaces of the wafer, is preferably free of COPs and oxygen precipitation nuclei. Such a wafer further improves the performance of the device. More preferably, the region of the silicon wafer 15 μm or deeper from all of the surfaces is free of COPs and oxygen precipitation nuclei.

Otherwise, if oxygen precipitation nuclei exist in the bulk portion, the bulk portion and the peripheral edge portion preferably uniformly contain oxygen precipitation nuclei. If oxygen precipitation nuclei are present uniformly not only in the peripheral edge portion but also in the bulk portion, strength of wafer and the gettering effect of metal impurities further improve.

In the latter case, it is preferable to control the density of oxygen precipitates in the bulk portion and the peripheral edge portion to $5.0 \times 10^8$ to $9.0 \times 10^9$ (in number)/cm$^3$, and control the size of such oxygen precipitates to 30 to 100 nm, after the wafer has been kept at 1000° C. for four hours in an argon atmosphere. While it is difficult to analyze the distribution of oxygen precipitation nuclei itself, it is possible to deduce such distribution from the distribution of oxygen precipitates produced by the above-described heat treatment.

If the above-described density of oxygen precipitates is less than $5.0 \times 10^8$/cm$^3$, or the size of such oxygen precipitates is less than 30 nm, no sufficient gettering effect of metal impurities may be obtainable. On the other hand, if the above-described density of oxygen precipitates is higher than $9.0 \times 10^9$/cm$^3$, or the size of such oxygen precipitates is larger than 100 nm, slip dislocation tends to develop from oxygen precipitates. In order to more effectively improve the gettering effect and reduce slip dislocation, it is more preferable to control the above-described density of oxygen precipitates to $2.0 \times 10^9$ to $7.0 \times 10^9$/cm$^3$, and control the size of such oxygen precipitates to 30 to 60 nm.

In this silicon wafer, oxygen precipitation nuclei are preferable exposed to the bevel surface of the wafer. With this arrangement, it is possible to effectively reduce slip dislocation during later heat treatment.

Further preferably, a surface layer near the opposite side of the device manufacturing surface of the wafer contains oxygen precipitation nuclei. Such an additional surface layer further improves strength of the wafer, further reduces slip dislocation, and further improves gettering effect of metal impurities.

Specific examples of the present invention are now described. It is however to be understood that the present invention is not limited to these examples. A silicon single-crystal ingot was grown by the Czochralski process while controlling the ratio of V to G, wherein V is the growth rate of the ingot in the axial direction, and G is the average temperature gradient in crystals in the axial direction within the range between the melting point of silicon and 1300° C., wherein the silicon ingot has a vacancy-rich region including an oxidation-induced stacking fault (OSF) region at a portion of a surface where there are numerous vacancies.

Figure 2:
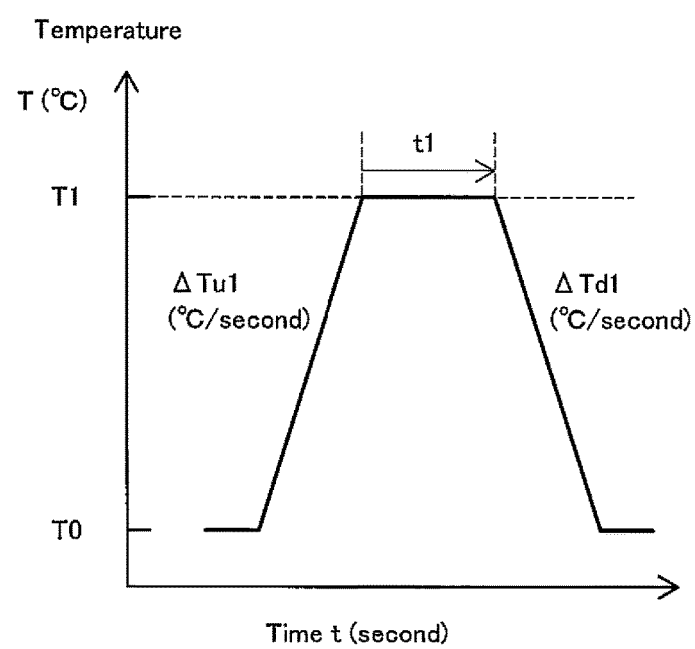
FIG. 2 shows a temperature sequence during RTP embodying the present invention.

A silicon wafer was (300 mm in diameter and 775 μm thick) was sliced from the vacancy-rich region and its both sides were mirror-polished. The wafer was then subjected to an RTP whose temperature sequence is shown in FIG. 2, in a gas atmosphere of 100% oxygen (flow rate: 20 slm). In FIG. 2, with the initial temperature T0 set at 600° C., the ramp-up rate $\Delta Tu1$ set at 10° C./second, and the holding time t1 at the maximum temperature T1 set at 30 seconds, the maximum temperature T1, the cooling rate $\Delta Td1$, and the concentration of oxygen in the substrate are determined as shown in Table 1.

Then, the device manufacturing surface of each wafer was polished by sliding polishing cloth along the device manufacturing surface with slurry disposed therebetween to remove material of the wafer to the thickness shown in Table 1. On the opposite side of the device manufacturing surface, material of the wafer was removed to the thickness not more than the value "a" [μm] calculated by equation (2). The bevel surface was polished until oxygen precipitation nuclei are exposed.

For the wafers obtained, after a predetermined heat treatment, it was determined whether there are oxygen precipitation nuclei and/or whether there is slip dislocation, in the following manners.

(Existence or Non-Existence of Oxygen Precipitation Nuclei)

The wafers were subjected to heat treatment in which the wafers were heated from 600° C. to 1000° C. at the ramp-up rate of 5° C./minute in an atmosphere of 100% argon (flow rate: 30 slm), kept at 1000° C. for four hours, and cooled from 1000° C. to 600° C. at the cooling rate of 5° C./minute. For the thus heat-treated wafers, it was determined whether or not there exist oxygen precipitation nuclei in the region from the device manufacturing surface to the depth of 5 μm, using an LSTD scanner (made by Raytex Corporation; MO601).

(Occurrence of Slip Dislocation)

The wafers were subjected to heat treatment in which the wafers were heated from 600° C. to 1200° C. at the ramp-up rate of 5° C./minute in an atmosphere of 100% argon (flow rate: 30 slm), kept at 1200° C. for one hour, and cooled from 1200° C. to 600° C. at the cooling rate of 5° C./minute. For the thus heat-treated wafers, slip dislocation lengths were measured using an X-ray topography system (made by Rigaku Corporation; XRT300). The results of measurement are shown in Table 1.

TABLE 1

| | Oxygen concentration in substrate (atoms/cm$^3$) | Maximum temperature reached T1 (° C.) | Cooling rate $\Delta$ Td1 (° C./sec) | Thickness of material removed (μm) | LSTD density (number/cm$^2$) | Slip dislocation length (mm) |
|---|---|---|---|---|---|---|
| Comparative Examle 1 | $1.20 \times 10^{18}$ | 1250 | 5 | 1 | 52 | — |
| Comparative Examle 2 | $1.20 \times 10^{18}$ | 1250 | 120 | 1 | 58 | — |
| Comparative Examle 3 | $8.00 \times 10^{17}$ | 1350 | 5 | X = 4.7 and more | $4.1 \times 10^{-2}$ | 120 |
| Example 1 | $1.20 \times 10^{18}$ | 1350 | 5 | X = 5.2 and more | $2.7 \times 10^{-2}$ | 4 |
| Example 2 | $1.20 \times 10^{18}$ | 1350 | 120 | X = 1.7 and more | $3.3 \times 10^{-2}$ | 2 |
| Example 3 | $1.20 \times 10^{18}$ | 1375 | 5 | X = 5.7 and more | $4.3 \times 10^{-2}$ | 5 |
| Example 4 | $1.50 \times 10^{18}$ | 1350 | 5 | X = 5.6 and more | $3.6 \times 10^{-2}$ | 0 |
| Comparative Examle 4 | $1.70 \times 10^{18}$ | 1350 | 5 | X = 5.9 and more | $2.9 \times 10^{-2}$ | 114 |
| Comparative Examle 5 | $1.20 \times 10^{18}$ | 1350 | 5 | a = 3.9 | $8.7 \times 10^{-1}$ | — |
| Comparative Examle 6 | $1.20 \times 10^{18}$ | 1350 | 120 | a = 1.1 | $7.0 \times 10^{-1}$ | — |
| Comparative Examle 7 | $1.20 \times 10^{18}$ | 1375 | 5 | a = 4.2 | $9.2 \times 10^{-1}$ | — |
| Comparative Examle 8 | $1.50 \times 10^{18}$ | 1350 | 5 | a = 4.4 | $9.0 \times 10^{-1}$ | — |
| Comparative Examle 9 | $1.20 \times 10^{18}$ | 1350 | 120 | 23 | 2 | — |

As is apparent from Table 1, for Examples 1 to 4 and Comparative Examples 3 and 4, the LSTD density was less than $1 \times 10^{-1}$/cm$^2$, which is a level so low as not to cause any problem during the device manufacturing steps, and it was also confirmed that these examples were practically free of oxygen precipitation nuclei and COPs.

On the other hand, when the heat treatment temperature (maximum temperature T1) during RTP is low (Comparative Example 2), it is considered that COPs remained. When material was removed to the thickness "a" [μm] calculated by equation (2) (Comparative Examples 5 to 8), it is considered that oxygen precipitation nuclei remained. Examples 1 to 4 are identical to Comparative Examples 5 to 8 except that material was removed to the thickness "X" [μm], which is the sum of the above value "a" and the value "b" [μm] calculated by equation (3). For Examples 1 to 4, it was confirmed that the LSTD density was less than $1 \times 10^{-1}$/cm$^2$.

When material was removed to the depth of 23 μm from the surface (Comparative Example 9), the defect-free surface layer of the wafer was presumably completely removed, and as a result, oxygen precipitates in the bulk portion were exposed. A long time was also needed to remove such a large amount of material.

When measuring slip dislocation lengths, slip dislocations were scarcely found in Examples 1 to 4. In Comparative Examples 3 and 4, slip dislocations were found. Slip dislocations presumably occurred in Comparative Examples 3 and 4, because in Comparative Example 3, the oxygen concentration in the substrate was too low to sufficiently reduce slip dislocation, and in Comparative Example 4, the oxygen concentration in the substrate was so high that oxygen precipitates in the peripheral edge portion and the back surface layer grew too large such that oxygen precipitates themselves became the sources of slip dislocation.

(Evaluation of Oxygen Precipitates)

Among the wafers for which it was determined whether or not there existed oxygen precipitation nuclei, for Examples 1 to 4 and Comparative Examples 1, 2 and 4, using an IR tomography system (made by Raytex Corporation; MO-441), the oxygen precipitates density and the scattered light intensity in the bulk portion within the range of 20 to 300 μm in depth from the surface of each wafer were measured at three points, i.e. the center of the wafer, a point in the ring OSF region (point radially spaced apart from the center of the wafer by 110 mm), and a point in the outer peripheral portion of the wafer (point radially spaced from the center of the wafer by 145 mm). For each wafer, the size of oxygen precipitates was calculated from the scattered light intensity based on the below-identified equation (4).

$$\text{(Size of oxygen precipitates)} = \text{(scattered light intensity)}^{1/6} \times 20 \quad (4)$$

The results of measurement are shown in Table 2.

TABLE 2

| | Density of oxygen precipitates (number/cm³) | | | | Average size of oxygen precipitates (nm) | | | |
|---|---|---|---|---|---|---|---|---|
| | Center | 110 mm from center | 145 mm from center | Maximum tolerance | Center | 110 mm from center | 145 mm from center | Maximum tolerance |
| Comparative Example 1 | $3.8 \times 10^9$ | $7.0 \times 10^8$ | $4.4 \times 10^9$ | $4.4 \times 10^9$ | 41 | 66 | 45 | 25 |
| Comparative Example 2 | $5.5 \times 10^9$ | $1.0 \times 10^9$ | $6.0 \times 10^9$ | $5.0 \times 10^9$ | 48 | 75 | 50 | 27 |
| Example 1 | Less than detectable limit | Less than detectable limit | Less than detectable limit | — | — | — | — | — |
| Example 2 | $5.8 \times 10^9$ | $5.7 \times 10^9$ | $5.9 \times 10^9$ | $2.0 \times 10^8$ | 34 | 35 | 36 | 2 |
| Example 3 | Less than detectable limit | Less than detectable limit | Less than detectable limit | — | — | — | — | — |
| Example 4 | Less than detectable limit | Less than detectable limit | Less than detectable limit | — | — | — | — | — |
| Comparative Example 4 | Less than detectable limit | Less than detectable limit | Less than detectable limit | — | — | — | — | — |

As will be apparent from the results of Tables 1 and 2, when the cooling rate during RTP was controlled to not more than 5° C./second, whereby the entire bulk portion of each wafer is free of oxygen precipitation nuclei (Examples 1, 3 and 4, and Comparative Examples 1 and 4), no oxygen precipitates were found in Examples 1, 3 and 4.

In Comparative Example 1, oxygen precipitates were observed because oxygen precipitation nuclei that are distributed ununiformly in the radial direction in the surface did not disappear when crystals are grown during RTP. Moreover, it was confirmed that the maximum tolerances of the density and size as measured at the above three points were large. For Comparative Example 4, while no oxygen precipitates were found in the bulk portion, it was confirmed that oxygen precipitates in the peripheral edge portion and the back surface layer grew so large as to become origins of slip dislocation, as is apparent from Table 1.

When the cooling rate during RTP was controlled to 120° C./second, whereby oxygen precipitation nuclei in the bulk portion are distributed uniformly in the radial direction of the surface of the wafer (Example 2 and Comparative Example 2), it was confirmed that uniformity in density and size of oxygen precipitates in the surface improved in Example 2.

In contrast, in Comparative Example 2, since oxygen precipitation nuclei that are distributed ununiformly in the radial direction in the surface did not disappear when crystals are grown, it was confirmed that the maximum tolerances of the density and size as measured at the above three points were large.

What is claimed is:

1. A method of manufacturing a silicon wafer comprising:
    subjecting a silicon wafer sliced from a silicon single-crystal ingot grown by a Czochralski process to a rapid thermal process in which the silicon wafer is heated to a maximum temperature within a range of 1300 to 1380° C., and kept at the maximum temperature for 5 to 60 seconds and then cooled at a cooling rate of 3 to 5° C./second, wherein the rapid thermal process is performed in an oxygen-containing atmosphere comprising oxygen gas having a partial pressure of 20 to 100%;
    calculating a surface layer of the wafer having a thickness of not less X [μm] according to the following equations (1) to (3):

$$X\ [\mu m] = a\ [\mu m] + b\ [\mu m] \quad (1);$$

$$a\ [\mu m] = (0.0031 \times \text{(said maximum temperature)}\ [°C.] - 3.1) \times 6.4 \times \text{(cooling rate)}^{-0.4}\ [°C./second] \quad (2); \text{ and}$$

$$b\ [\mu m] = a / \text{(solid solubility limit of oxygen)}\ [\text{atoms/cm}^3] / \text{(oxygen concentration in substrate)}\ [\text{atoms/cm}^3] \quad (3); \text{ and}$$

removing the surface layer having the thickness of not less than X,
    to obtain a silicon wafer comprising a laser scattering tomography defect (LSTD) density of less than $1 \times 10^{-1}/\text{cm}^2$ and a slip dislocation length of 5 mm or less.

2. The method of claim 1, wherein during the step of removing the surface layer, a side peripheral surface of the silicon wafer is removed by a thickness which is not more than the above-defined value "a".

3. The method of claim 1, wherein during the step of removing the surface layer, a bevel surface of the wafer is removed such that oxygen precipitation nuclei are exposed.

* * * * *